United States Patent [19]

Agnus et al.

[11] 4,059,804
[45] Nov. 22, 1977

[54] FREQUENCY COMPARISON CIRCUIT

[75] Inventors: Pierre Agnus; Henri Butin, both of Paris, France

[73] Assignee: Thomson-CSF, Paris, France

[21] Appl. No.: 743,333

[22] Filed: Nov. 19, 1976

[30] Foreign Application Priority Data

Nov. 25, 1975  France .................................. 75.36003

[51] Int. Cl.$^2$ ............................................. H03D 13/00
[52] U.S. Cl. ..................................... 328/134; 328/44; 324/78 D; 324/78 Z; 328/55
[58] Field of Search ............... 328/133, 134, 140, 141, 328/55, 44; 324/78 R, 78 D, 78 Z

[56]                 References Cited
            U.S. PATENT DOCUMENTS

| 3,200,340 | 8/1965 | Dunne | 328/134 X |
| 3,626,307 | 12/1971 | Koyama | 328/133 |
| 3,735,324 | 5/1973 | Phillips | 328/133 |
| 3,956,705 | 5/1976 | Mayer | 328/133 |

Primary Examiner—John S. Heyman
Attorney, Agent, or Firm—Cushman, Darby & Cushman

[57] ABSTRACT

A frequency comparison circuit for determining, at least within certain limits of accuracy, whether the frequency of a received signal is equal or not to a frequency F. Generating means produce first and second reference signals at frequency F, in phase quadrature. A logic circuit periodically compares the signs $m$, $p$ and $q$ of the received signal and of the two reference signals and according to the results of these comparisons ($m$, $p$ and $q$ alike, or $m$ different from $p$ and $q$, or $q$ different from $m$ and $p$ and $p$ different from $m$ and $q$) applies a pulse to the plus or minus input of a first bidirectional counter or to the plus or minus input of a second bidirectional counter, one of the two counters overflowing when the frequency of the received signal is sufficiently close to F. In a variant embodiment the second reference signal has a frequency 2F.

5 Claims, 3 Drawing Figures

FREQUENCY COMPARISON CIRCUIT

This invention relates to a frequency comparison circuit for determining, within certain limits of accuracy, either whether the frequency of a received signal is equal or not to a frequency F, or the difference between those frequencies.

In known comparison circuits of this type, reference signals at the frequency F are in phase quadrature, are mixed with the received signal in a multiplication circuit, squared and added. A threshold circuit connected to the output of the addition circuit gives the result of the comparison.

These known comparison circuits are complex, in particular because they necessitate squaring circuits. In addition, they do not readily lend themselves to construction in binary logic.

The object of the present invention is to obviate these disadvantages by means of a comparison circuit having in addition the following advantages: adjustable decision threshold, results independent of the amplitude of the received signal, stability.

According to the invention, there is provided a frequency comparison circuit for comparing the frequency of a received signal with a frequency F and comprising:

first means for producing, independently of the received signal, a reference signal having the frequency F, second means for generating sampling pulses, third means for determining as a function of time $t$ the relation between the sign "$m$" of the received signal at time $t$, the sign "$p$" of said reference signal at time $t$ and the sign "$q$" of said reference signal at time $t$-T, T being a predetermined time interval such that $2\pi FT$ is not a multiple of $\pi$, and for generating a first relation signal if "$m$" is different from "$p$" and "$q$", a second relation signal if "$m$", "$p$" and "$q$" are alike, a third relation signal if "$m$" is identical with "$p$" and different from "$q$" and a fourth relation signal if "$m$" is different from "$p$" and identical with "$q$"

first and second bidirectional counting means, means controlled by said third means for, for each sampling pulse, causing said first bidirectional counting means to change its count if one of said first or second relation signal is present, the change being in one direction or the other according to whether said first or said second relation signal is present, and causing said second bidirectional counting means to change its count if one of said third or fourth relation signal is present, the change being in one direction or the other according to whether said third or fourth relation signal is present, and an output circuit comprising first detecting means, coupled to said first bidirectional counting means, for providing a first output signal for a predetermined value of the count of said first bidirectional counting means, and second detecting means, coupled to said second bidirectional counting means, for providing a second output signal for a predetermined value of the count of said second bidirectional counting means.

The invention will be better understood and other features thereof will become apparent from the following description in conjunction with the accompanying drawings, wherein:

FIG. 1 is a vectorial diagram in rectangular coordinates (Ox and Oy) of two signals $E_1$ and $E_2$ at the same frequency F and in phase quadrature. The corresponding vectors are respectively supported by the two perpendicular axes OX and OY and form angles of $c$ and $c + 90°$ with the axis Ox.

A third signal E will first be assumed to have a frequency also equal to the frequency F; the corresponding vector forms an angle $d$ with the axis Ox. In this diagram, the vectors corresponding to the signals E, $E_1$ and $E_2$, rotate about O at a speed corresponding to the frequency F.

Figure 1:
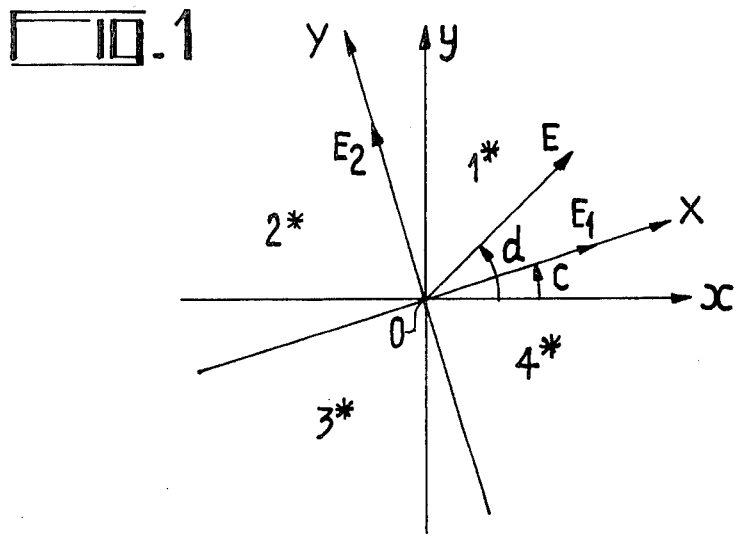
FIG. 1 shows the vectors corresponding to three voltages in rectangular coordinates.

Let $S(E)$, $S(E_1)$ and $S(E_2)$ be functions of the time $t$, having the values 1 or 0, according to whether the sines of the angles $d$, $c$ and $c + 90°$ are positive or negative, i.e. according to whether the signs of the signals E and $E_1$ at time $t$ and of the signal $E_1$ at time $t - T$ (with $2\pi FT = (3\pi/2)$) are positive or negative. In the description and in the claims "sign of a signal" means the sign of its amplitude relatively to its average value. It is easy to check that within a period (1/F): 1) with E in the first quadrant XOY, 1* (i.e. in the case of FIG. 1) and $\oplus$ signifying sum modulo 2, $$S_p = [S(E) \oplus S(E_1)] \cdot [S(E) \oplus S(E_2)] \equiv 0$$

$$S_n = \overline{[S(E) \oplus S(E_1)]} \cdot \overline{[S(E) \oplus S(E_2)]}$$

equal to 1 during 50% of the period and to 0 during the other 50%, $$D_p = [S(E) \oplus S(E_1)] \cdot \overline{[S(E) \oplus S(E_2)]}$$

and $$D_n = \overline{[S(E) \oplus S(E_1)]} \cdot [S(E) \oplus S(E_2)]$$

equal to 0 during more than 50% of the period and to 1 for the remainder of the period; the function $D_p$ remaining equal to 1 longer than the function $D_n$ (in the case of FIG. 1 where the phase shift between E and $E_1$ is less than 45°).

2. with E in the second quadrant XOY, 2*, $$D_p \equiv 0$$

$D_n$ equal to 1 for 50% of the period and to 0 for the other 50%

$S_n$ and $S_p$ equal to 0 for more than 50% of the period 3. with E in the third quadrant XOY, 3*, $$S_p \equiv 0$$

$S_n$ equal to 1 for 50% of the period and to 0 for the other 50%

$D_n$ and $D_p$ equal to 0 for more than 50% of the period 4. with E in the fourth quadrant XOY, 4*

$$D_n \equiv 0$$

$D_p$ equal to 1 for 50% of the period and to 0 for the other 50%

$S_n$ and $S_p$ equal to 0 for more than 50 % of the period.

Thus, irrespective of the position of E in relation to the signals $E_1$ and $E_2$, one of the four functions of the two groups of functions $S_n$, $S_p$ and $D_n$, $D_p$ always remains identically zero while the other function of the group is equal to "1" for half the time. Accordingly, if the difference between the durations of the "1" states of $S_n$ and $S_p$ is established in a first bidirectional counter and the difference between the durations of the "1"

states of $D_n$ and $D_p$ in a second bidirectional counter, one of these counters would only count in the up or down direction (in the case of FIG. 1, it will be the first counter), so that it will overrun. The two counters will of course have to be initialised at the moment the counting process is initiated.

It has been assumed, in a first hypothesis, that E was at the same freqency F as $E_1$ and $E_2$. If this is not the case, E will enter successively into each of the four quadrants. In that case, overrunning will only occur if E remains in one quadrant long enough to cause one counter to overrun because otherwise, what the considered counter has counted up during the passage of E in a quadrant will be counted down during the passage of E in the opposite quadrant. Accordingly, overrunning will only occur if, for a given counter capacity, the difference $\Delta F$ between the frequency of the received signal and the expected frequency F is sufficiently small; there is thus a filtering effect.

For a given counter capacity and above a threshold value of $\Delta F$ each of the counters will pass back through its initial count with a frequency equal to $2\Delta F$. Accordingly, this affords the possibility of measuring the difference between the frequency of the received signal and the frequency F.

In the foregoing, the signals $E_1$ and $E_2$ which serve as references are phase-shifted through 90°. It is obvious that this 90° phase-shift is not a condition sine qua non for producing a counter overrun in the case where E is at the frequency F or at a neighbouring frequency. The only condition is that this phase-shift should be different from $k\pi$ (where $k$ is a positive integer or zero). However if the phase-shift is different from $k\pi$ and from $(k\pi + (\pi/2))$, axes OX and OY will form two acute angles and two obtuse angles and overrunning will take place more rapidly when the vector representative of E is located in one of the two acute angles and more slowly in the opposite case.

Figure 2:
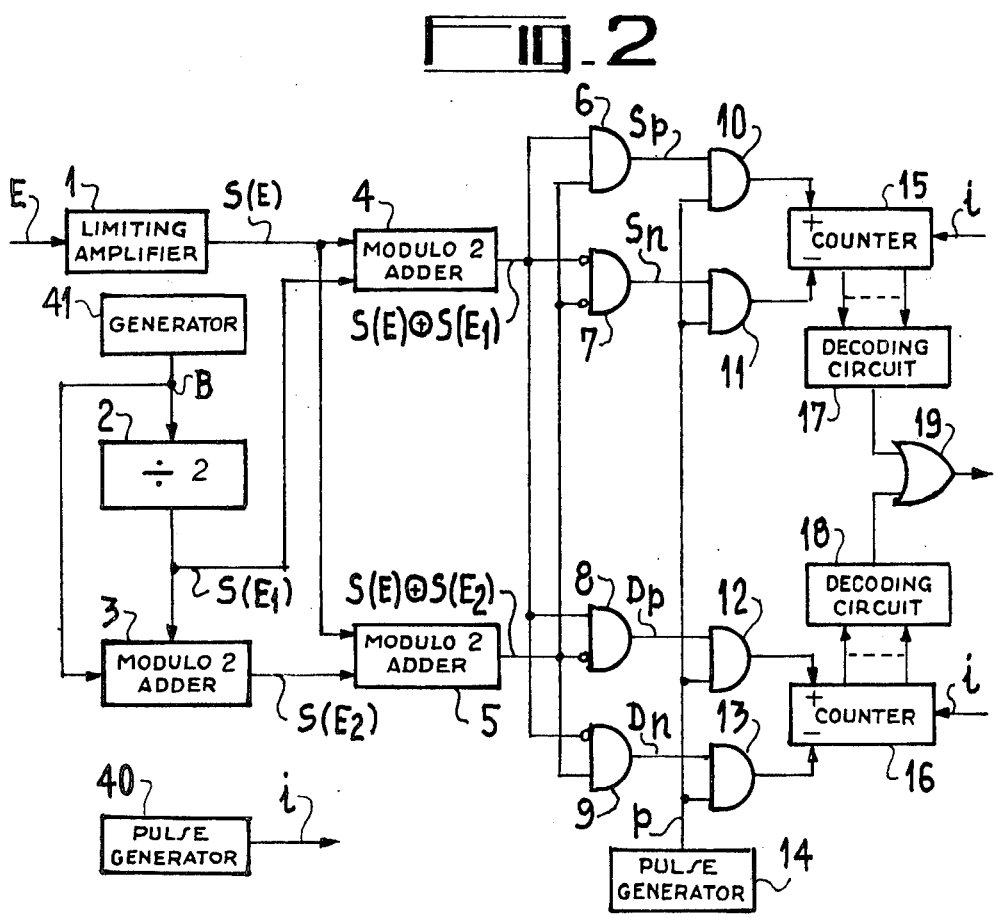
FIGS. 2 and 3 are block diagrams of circuits according to the invention.

FIG. 2 shows how a frequency comparison circuit operating on the principle of frequency comparison, of which the theoretical explanation was given in reference to FIG. 1, can be produced from a limiting amplifier 1 and binary logic circuits.

In the following, the signals corresponding respectively to the functions $S(E)$, $S(E_1)$, $S(E_2)$, $S(E) \oplus S(E_1)$ etc., introduced in the description of FIG. 1, will bear the same names as the functions to which they correspond.

The received signal E is applied to the input of the limiting amplifier 1 to form a rectangular signal. The upper and lower levels of this rectangular signal form levels "1" and "0", respectively representative of the positive and negative amplitudes of the signal E, for the logic circuits which follow the limiting amplifier 1. Accordingly, this rectangular signal is representative of the quantity $S(E)$.

Similarly, the quantities $S(E_1)$ and $S(E_2)$ are in this case formed from a rectangular signal B delivered by a generator 41 and of which the frequency is twice the frequency F. To this end, the signal B is applied to a divider by two 2 which supplies a rectangular signal $S(E_1)$, while the signal $S(E_2)$, corresponding to the signal $S(E_1)$ shifted through 90°, is obtained at the output of a modulo two adder 3 to whose inputs the signals B and $S(E_1)$ are applied.

The signals $S(E) \oplus S(E_1)$ and $S(E) \oplus S(E_2)$ are supplied respectively by two modulo two adders 4 and 5. The signals $S(E)$ and $S(E_1)$ are applied to the two inputs of the adder 4, and the signals $S(E)$ and $S(E_2)$ are applied to the two inputs of the adder 5.

The signals $S(E) \oplus S(E_1)$ and $S(E) \oplus S(E_2)$ are respectively applied to the first and second inputs of four AND gates 6 to 9; the two inputs of gate 7, the second input of gate 8, and the first input of gate 9 being inputs with inversion, the gates 6, 7, 8 and 9 thus respectively supply signals $S_p$, $S_n$, $D_p$, $D_n$.

In order to obtain a signal representative of the difference between the durations of the "1" states of the signals $S_n$ and $S_p$, the arrangement shown in FIG. 2 comprises a bidirectional counter 15 to whose up input "+" the signal $S_p$ is applied through an AND gate 10 and to whose down input "−" the signal $S_n$ is applied through an AND gate 11. The opening of the gates 10 and 11 is controlled by sampling pulses p at a sampling frequency $f$ much higher than the frequency F. These pulses $p$ are supplied by a pulse generator 14. The counter 15 has an input by which it is reset to the count equal to half its maximum count under the control of a signal $i$ supplied by a pulse generator 40.

The passage of the counter 15 through its maximum count either by up counting or by down counting is observed by means of a decoding circuit 17 of which the output is connected to the first of the two inputs of an OR gate 19.

For forming the signal representative of the difference between the durations of the "1" states of the signal $D_n$ and $D_p$, the arrangement shown in FIG. 2 comprises a bidirectional counter 16 to whose up input "+" the signal $D_p$ is applied through an AND gate 12 and to whose down input "−" the signal $D_n$ is applied through an AND gate 13. The opening of the gates 12 and 13 is controlled by pulses $p$ supplied by the generator 14. The counter 16 has an input by which it is reset to the count equal to half its maximum count under the control of the same signal $i$ as the corresponding input of the counter 15.

The passage of the counter 16 through its maximum count either by up counting or by down counting is observed by means of a decoding circuit 18 whose output is connected to the second of the two inputs of the OR gate 19.

When the OR gate 19 supplies a signal, this means that, as shown with reference to FIG. 1, the signal $S(E)$ is at a frequency equal or close to the frequency F of the signals $S(E_1)$ and $S(E_2)$. The signal supplied by the OR gate 19 is thus the decision signal of the frequency comparison circuit. The output of the OR gate is connected to the input of a circuit (not shown) for the visualisation or utilisation of the signal.

If E is at the frequency F, the counter which only counts in one direction (for 50% of the time) will receive a number of pulses equal to $(1/2F) \cdot f$ (where $f$ is, as indicated above, the sampling frequency) during a period $1/F$, providing of course no noise has been mixed with the signal E. Otherwise, the signal $S(E) \oplus S(E_1)$ will be disturbed, resulting in the disappearance of certain pulses which ought to have been counted, and in the appearance of disturbing pulses at the input of the counter which ought not to be receiving anything. This will result in an increase in the response time of the circuit. The more noise present in the received signal, the longer will be the response time of the circuit. Accordingly, it is possible, by measuring the response time and by calibration beforehand, to determine the signal-to-noise ratio of the received signal.

It has not yet been pointed out what the characteristics of the signal $i$ by which the bidirectional counters 15 and 16 are reset to the count equal to half their maximum count should be. This signal may be a single pulse delivered at the moment when a new comparison cycle is initiated, for example by an operator. However, it may also be, as in the present case, a periodic signal composed of pulses of which the first is delivered at the moment of release. The period of this signal is selected to be long enough not to interfere with the overrun due to the received signal when the frequency thereof is equal to or sufficiently close to F, and short enough to prevent any overrun when, the received signal being at a frequency too remote from F, the counters are in danger of overrunning solely as a function of the noise.

By way of example, a frequency comparison circuit was constructed on the basis of the circuit illustrated in FIG. 2 with $F = 1600$c/s and $f = 35$kc/s and a signal $i$ of which the frequency was taken to be equal to 6.25 Hz.

Figure 3:
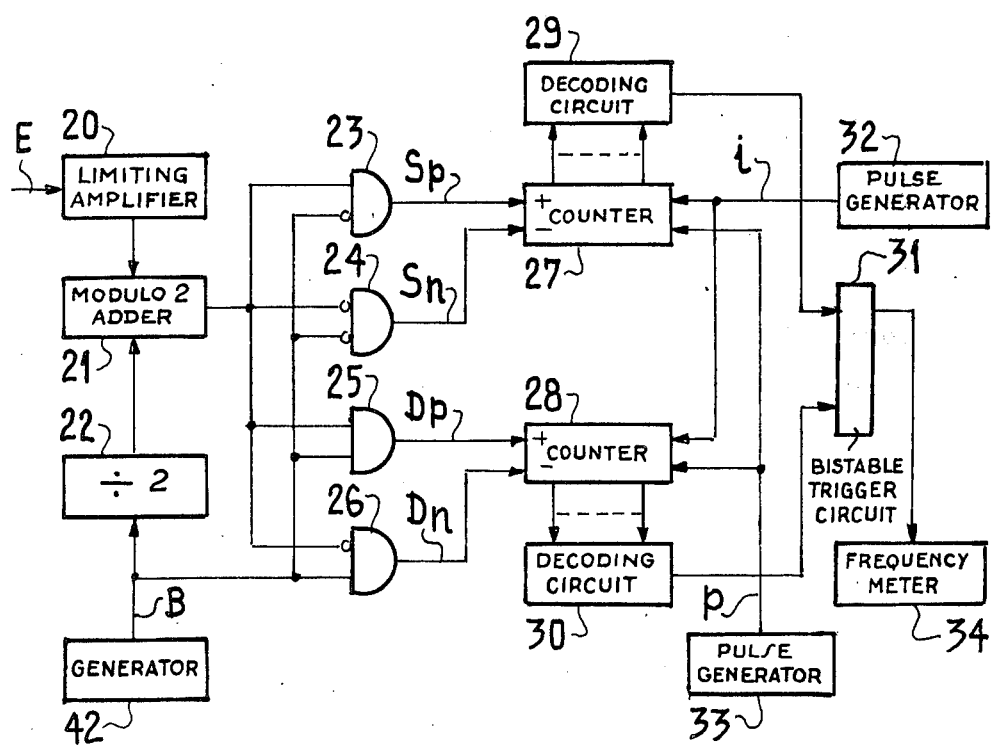

FIG. 3 is a second example of a circuit according to the invention. In this circuit, the signals $S_p$, $S_n$, $D_p$ and $D_n$ are formed from signals S(E), S(E$_1$) and B (where B is, as in FIG. 2, a rectangular signal at the frequency 2F). It will be observed that $S_p$, $S_n$, $D_p$, $D_n$ may also be written:

$S_p = [S(E) \oplus \overline{S(E_1)}] \cdot [S(E) \oplus S(E_2)] = [S(E) \oplus S(E_1)]\overline{B}$ $S_n = \overline{[S(E) \oplus S(E_1)]} \cdot \overline{B}$ $D_p = [S(E) \oplus S(E_1)] \cdot B$ $D_n = \overline{[S(E) \oplus S(E_1)]} \cdot B$ As in the frequency comparison circuit shown in FIG. 2, the received signal E is applied to the input of a limiting amplifier 20 to form a rectangular signal S(E). A rectangular signal B, of which the frequency is twice the frequency F, is produced by a generator 42; this rectangular signal is applied to the input of a divider by two 22, which supplies a rectangular signal S(E$_1$). The signals S(E) and S(E$_1$) are respectively applied to the two inputs of a modulo two adder 21 which thus supplies the signal S(E) $\oplus$ S(E$_1$) at its output.

The signals S(E) $\oplus$ S(E$_1$) and B are respectively applied to the first and second inputs of four gates 23 to 26; the second input of gate 23, the two inputs of gate 24 and the first input of gate 26 being inputs with inversion, the gates 23 to 26 respectively supply signals $S_p$, $S_n$, $D_p$, $D_n$.

The signal $S_p$ is directly applied to the up input "+" of a bidirectional counter 27 of which the down input "−" receives the signal $S_n$. This counter has a clock input and for each pulse applied to this input is allowed to count. Pulses $p$ at a frequency $f$ much higher than the frequency F are delivered by a generator 33 and are applied to the clock input of counter 27. In addition, the counter 27 has an initiating input by which it is reset to the count equal to half its maximum count under the control of a signal $i$ supplied by a releasing circuit 32. In this case, the signal $i$ is formed by a single pulse of which the delivery is determined by the initiation of a new comparison cycle.

Unlike the circuit shown in FIG. 2, the frequency comparison circuit shown in FIG. 3 is not used to verify whether the received signal is at the frequency F, but instead to measure the difference between the frequency of the received signal and the frequency F. This measurement can of course only be made if the frequency of the received signal is sufficiently different from F.

The passage of the counter 27 through the count equal to half its maximum count (and no longer through its maximum count) is observed by means of a decoding circuit 29 of which the output is connected to the first of the two inputs of a bistable trigger circuit 31.

Similarly, signals $D_p$ and $D_n$ are respectively applied to the up and down inputs of a bidirectional counter 28 which is identical with the bidirectional counter 27, and whose clock input also receives the pulses $p$ and whose initiating input also receives pulses $i$.

The passage of the counter 28 through its half-capacity is observed by means of a decoding circuit 30 of which the output is connected to the second input of the bistable trigger circuit 31.

The signal supplied by the bistable trigger circuit 31 is a rectangular signal which, as indicated in the description of FIG. 1, has a frequency twice the value of the difference between the frequency of the received signal and the frequency F. The value of this frequency is measured by means of a frequency meter 34 connected to the bistable trigger circuit 31.

It is pointed out that the arrangement shown in FIG. 3, in the section preceding the bidirectional counters, needs two modulo two counters less than the arrangement shown in FIG. 2. Further, the AND gates 10 to 13 shown in FIG. 2 do not have any direct equivalents in FIG. 3. This is due to the use of bidirectional counters 27, 28 with clock inputs to which the pulses $p$ are applied. So far as the AND gates 23 to 26 in FIG. 3 are concerned, they could be omitted by using bidirectional counters having a blocking input. In this case, the signal of the modulo two counter 21 would be directly applied to one of the up/down inputs of the counters 27, 28 and, after inversion, would be applied to the other input, whilst the signal B would be directly applied to the blocking input of the counter 27 and, after inversion, would be applied to the blocking input of the counter 28.

It will be observed that with two reference signals at frequency F, the second may be obtained with any desired phase-shift relatively to the first one through delaying the first one by an amount of T corresponding to this phase-shift. As a general rule, however, the use of phase shifts different from 90° is of no advantage.

It is of course possible to conceive other variants of the frequency comparison circuit according to the invention. For example, the bidirectional counters and the decoding circuits of FIGS. 2 and 3 could be replaced by analog integrators followed by threshold circuits.

Of course, the invention is not limited to the embodiments described and shown which were given solely by way of example.

What is claimed is:

1. A frequency comparison circuit for comparing the frequency of a received signal with a frequency F and comprising:
   first means for producing, independently of the received signal, a reference signal having the frequency F,
   second means for generating sampling pulses,
   third means for determining as a function of time $t$ the relation between the sign "$m$" of the received signal at time $t$, the sign "$p$" of said reference signal at time $t$ and the sign "$q$" of said reference signal at time $t-T$, T being a predetermined time interval such that $2\pi FT$ is not a multiple of $\pi$, and for generating a first relation signal if "$m$" is different from "$p$" and "$q$", a second relation signal if "$m$", "$p$" and "$q$" are alike, a third relation signal if "$m$" is identical with "$p$" and different from "$q$" and a fourth relation signal if "$m$" is different from "$p$" and identical with "$q$"

first and second bidirectional counting means, means controlled by said third means for, for each sampling pulse, causing said first bidirectional counting means to change its count if one of said first or second relation signal is present, the change being in one direction or the other according to whether said first or said second relation signal is present, and causing said second bidirectional counting means to change its counts if one of said third or fourth relation signal is present, the change being in one direction or the other according to whether said third or fourth relation signal is present, and an output circuit comprising first detecting means, coupled to said first bidirectional counting means, for providing a first output signal for a predetermined value of the count of said first bidirectional counting means and second detecting means, coupled to said second bidirectional counting means, for providing a second output signal for a predetermined value of the count of said second bidirectional counting means.

2. A frequency comparison circuit as claimed in claim 1, for determining whether the frequency of the received signal is substantially equal or not to said frequency F, wherein said predetermined value is for each bidirectional counting means its maximum count and wherein said output circuit further comprises an OR gate for directing to a single output said first and second output signals.

3. A frequency comparison circuit as claimed in claim 1, for measuring the difference between the frequency of said received signal and said frequency F, wherein said predetermined value is for each bidirectional counting means half its maximum count, and wherein said output circuit further comprises a bistable trigger circuit having two inputs respectively connected to the two detecting means, and means for measuring the frequency of the output signal from said trigger circuit.

4. A frequency comparison circuit as claimed in claim 1, wherein said third means include means for generating a second reference signal at the frequency F so phase-shifted relatively to the first mentioned reference signal that its phase at time $t$ is the same as that of the first mentioned reference signal at time $t-T$.

5. A frequency comparison circuit as claimed in claim 1, wherein $2\pi FT$ is an add multiple of $\pi/2$.

* * * * *